(12) United States Patent
Tung

(10) Patent No.: US 8,866,230 B2
(45) Date of Patent: Oct. 21, 2014

(54) SEMICONDUCTOR DEVICES

(75) Inventor: Yu-Cheng Tung, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 16 days.

(21) Appl. No.: 13/456,227

(22) Filed: Apr. 26, 2012

(65) Prior Publication Data
US 2013/0285146 A1 Oct. 31, 2013

(51) Int. Cl.
*H01L 27/088* (2006.01)

(52) U.S. Cl.
USPC .................................. 257/368; 257/E27.06

(58) Field of Classification Search
CPC ................................................... H01L 27/088
USPC ............................................ 257/368, E27.06
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |

(Continued)

OTHER PUBLICATIONS

Hwang et al., Title: Strained Silicon Structure , pending U.S. Appl. No. 12/957,304, filed Nov. 30, 2010.

*Primary Examiner* — Kevin Parendo
*Assistant Examiner* — Lamont Koo
(74) *Attorney, Agent, or Firm* — Winston Hsu; Scott Margo

(57) ABSTRACT

Semiconductor devices include a substrate, a first gate structure and a second gate structure positioned on the substrate, and a first source/drain formed in the substrate respectively at two sides of the first gate structure and a second source/drain formed in the substrate respectively at two sides of the second gate structure. The first gate structure and the second gate structure include a same conductivity type. The first source/drain and the second source/drain are different.

13 Claims, 8 Drawing Sheets

(56) References Cited

U.S. PATENT DOCUMENTS

| | | |
|---|---|---|
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,736,982 B2 | 6/2010 | Liao et al. |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0235817 A1* | 10/2007 | Wang et al. .................. 257/392 |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0078689 A1* | 4/2010 | Kronholz et al. ............ 257/288 |
| 2010/0093147 A1 | 4/2010 | Liao |
| 2010/0193840 A1* | 8/2010 | Doyle et al. .................. 257/192 |
| 2011/0278680 A1* | 11/2011 | Tews et al. .................... 257/392 |
| 2012/0161203 A1* | 6/2012 | Flachowsky et al. ......... 257/192 |
| 2013/0207166 A1* | 8/2013 | Chen et al. ................... 257/288 |
| 2013/0234261 A1* | 9/2013 | Wei et al. ..................... 257/408 |

* cited by examiner

SEMICONDUCTOR DEVICES

BACKGROUND OF THE INVENTION

1. Field of the Invention

The present invention relates to semiconductor devices, and more particularly, to semiconductor devices having an epitaxial source/drain.

2. Description of the Prior Art

Epitaxial structures are prevalently used in a wide variety of semiconductor applications. For example, the prior art usually forms an epitaxial layer such as a silicon germanium (hereinafter abbreviated as SiGe) layer in a single crystal substrate by performing a selective epitaxial growth (hereinafter abbreviated as SEG) method. Since the epitaxial layer has the crystalline orientation almost identical to the crystalline orientation of the substrate, the epitaxial layers serves as a raised source/drain or a recessed source/drain for the semiconductor device. Because the lattice constant of the epitaxial SiGe layer is larger than that of the silicon substrate, a strain stress is generated to the channel region of the meta-oxide semiconductor (hereinafter abbreviated as MOS) transistor device. Accordingly, carrier mobility in the channel region is improved and the speed of the MOS transistor device is increased.

Although the epitaxial structures efficiently improve device performance, it increases complexity of the semiconductor fabrication and difficulties of process control. More important, devices of different conductivity types require strain stresses of different types, even the devices of the same conductivity type require strain stresses of the same type but different magnitudes. Therefore, it is getting more and more difficult to design and fabricate semiconductor devices having epitaxial structures.

Accordingly, though the epitaxial structure is able to improve the device performance, it is always in need to provide semiconductor devices as expected when the progress of semiconductor manufacturing technology is improved and complexity of the products is increased.

SUMMARY OF THE INVENTION

According to an aspect of the present invention, semiconductor devices are provided. The semiconductor devices include a substrate, a first gate structure and a second gate structure positioned on the substrate, and a first source/drain positioned in the substrate respectively at two sides of the first gate structure and a second source/drain positioned in the substrate respectively at two sides of the second gate structure. The first gate structure and the second gate structure include a same conductivity type. The first source/drain and the second source/drain are different from each other.

According to the semiconductor devices provided by the present invention, the transistor devices of the same conductivity type include different source/drain such as different source/drain providing different strain stresses. Therefore the semiconductor devices provided by the present invention satisfy requirements of different strain stresses for devices performing different functions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating semiconductor devices provided by a first preferred embodiment of the present invention, wherein FIG. 2 is a schematic drawing in a step subsequent to FIG. 1;

FIG. 3 is a schematic drawing in a step subsequent to FIG. 2;

FIG. 4 is a schematic drawing in a step subsequent to FIG. 3;

FIG. 5 is a schematic drawing illustrating a modification to the preferred embodiment;

FIG. 6 is a schematic drawing illustrating another modification to the preferred embodiment; and FIG. 7 is a schematic drawing in a step subsequent to FIG. 4.

DETAILED DESCRIPTION

Figure 1:
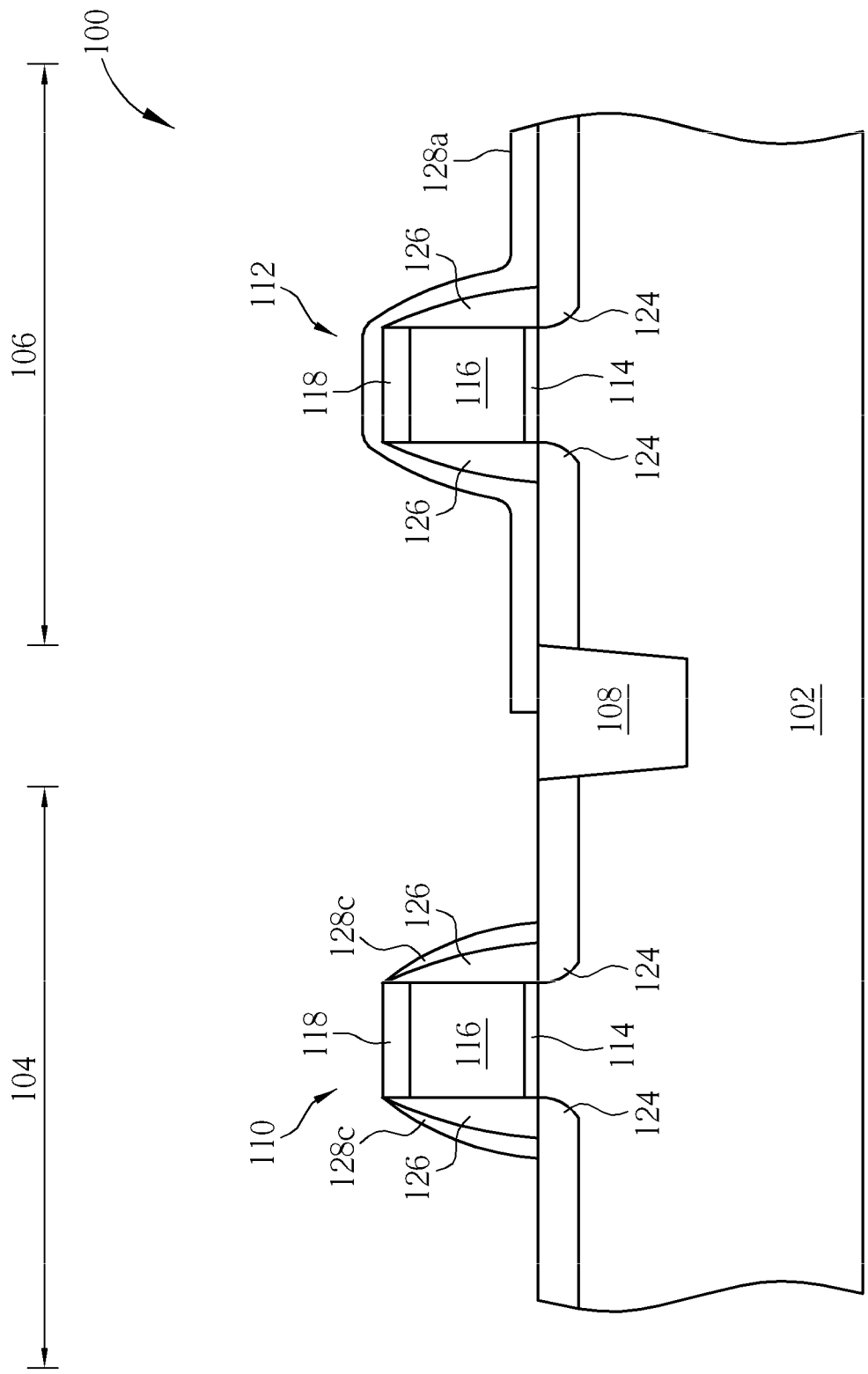

Please refer to FIGS. 1-7, which are schematic drawings illustrating semiconductor devices provided by a first preferred embodiment of the present invention. As shown in FIG. 1, the semiconductor devices 100 provided by the preferred embodiment include a substrate 102 having a first region 104 and a second region 106 defined thereon. The first region 104 and the second region 106 are to accommodate devices performing different functions. And a shallow isolation (STI) 108 is formed in between the first region 104 and the second region 106 for providing electrical isolation. A first gate structure 110 and a second gate structure 112 are formed on the substrate 102 respectively in the first region 104 and the second region 106. The first gate structure 110 and the second gate structure 112 respectively include a gate dielectric layer 114, and the gate dielectric layer 114 can include high dielectric constant (high-k) material or silicon oxide. The first gate structure 110 and the second gate structure 112 further include a gate electrode 116 defined by a patterned hard mask 118, respectively. The gate electrode 116 can include metal or polysilicon. It is noteworthy that the first gate structure 110 and the second gate structure 112 include a same conductivity type. For example, the first gate structure 110 and the second gate structure 112 are gate structures respectively for two p-type transistor devices performing different functions. Furthermore, lightly-doped drains (LDDs) 124 of the same conductivity type are formed in the substrate 102 respectively at two sides of the first gate structure 110 and the second gate structure 112. Spacers 126 are formed on sidewalls of the first gate structure 110 and the second gate structure 112, respectively. Moreover, a patterned mask layer 128a covering the second region 106 but exposing the first region 104 is formed on the substrate 102.

Figure 2:
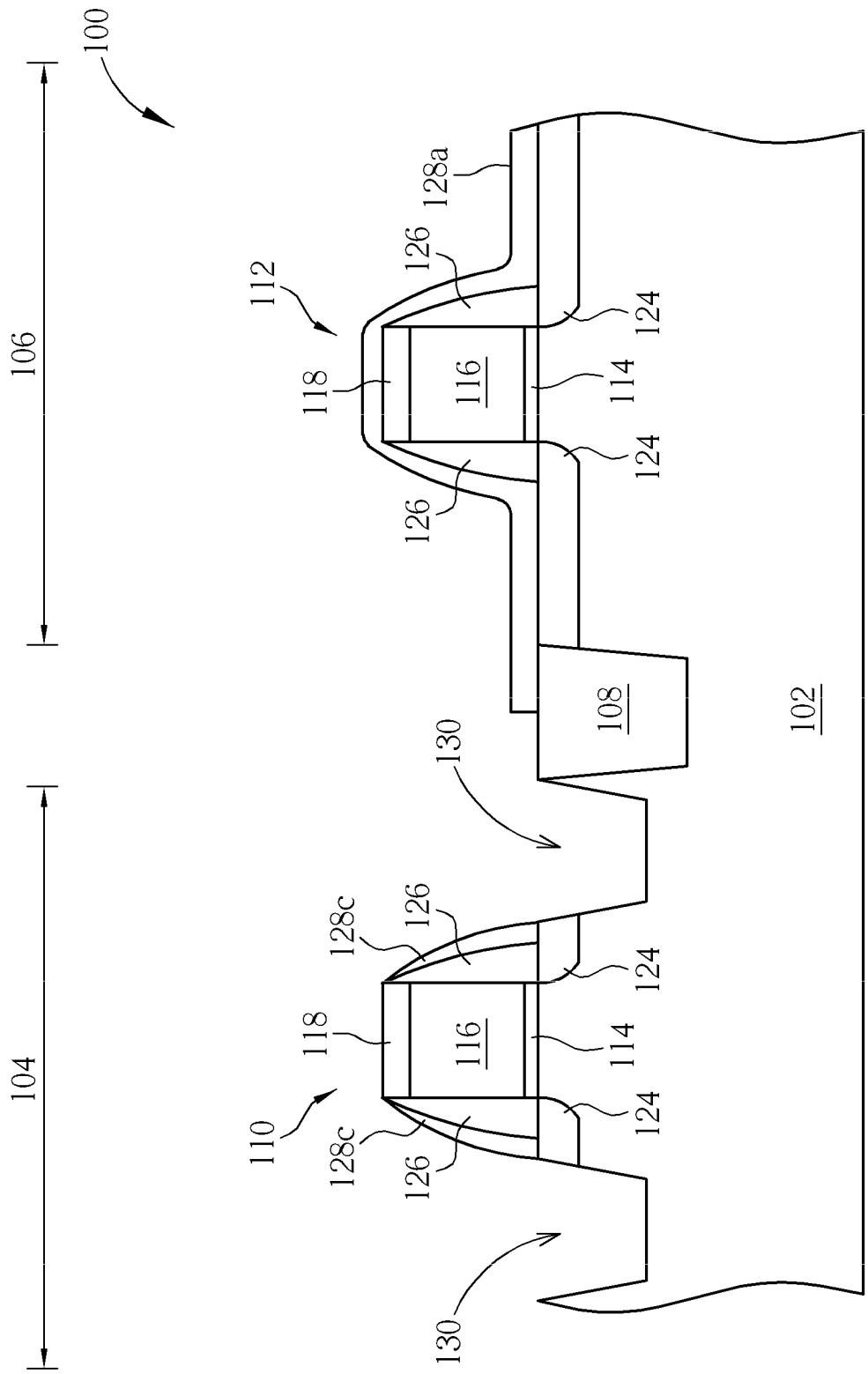

Please refer to FIG. 2. Next, the patterned mask layer 128a, the patterned hard mask 118, and the spacer 126 serve as an etching mask and an etching process is performed to form a disposal spacer 128c on the spacer 126 and first recesses 130 in the substrate 102 respectively at two sides of the first gate structure 110 in the first region 104. Then, a cleaning step is performed to remove native oxide or other impurities from the first recesses 130.

Figure 3:
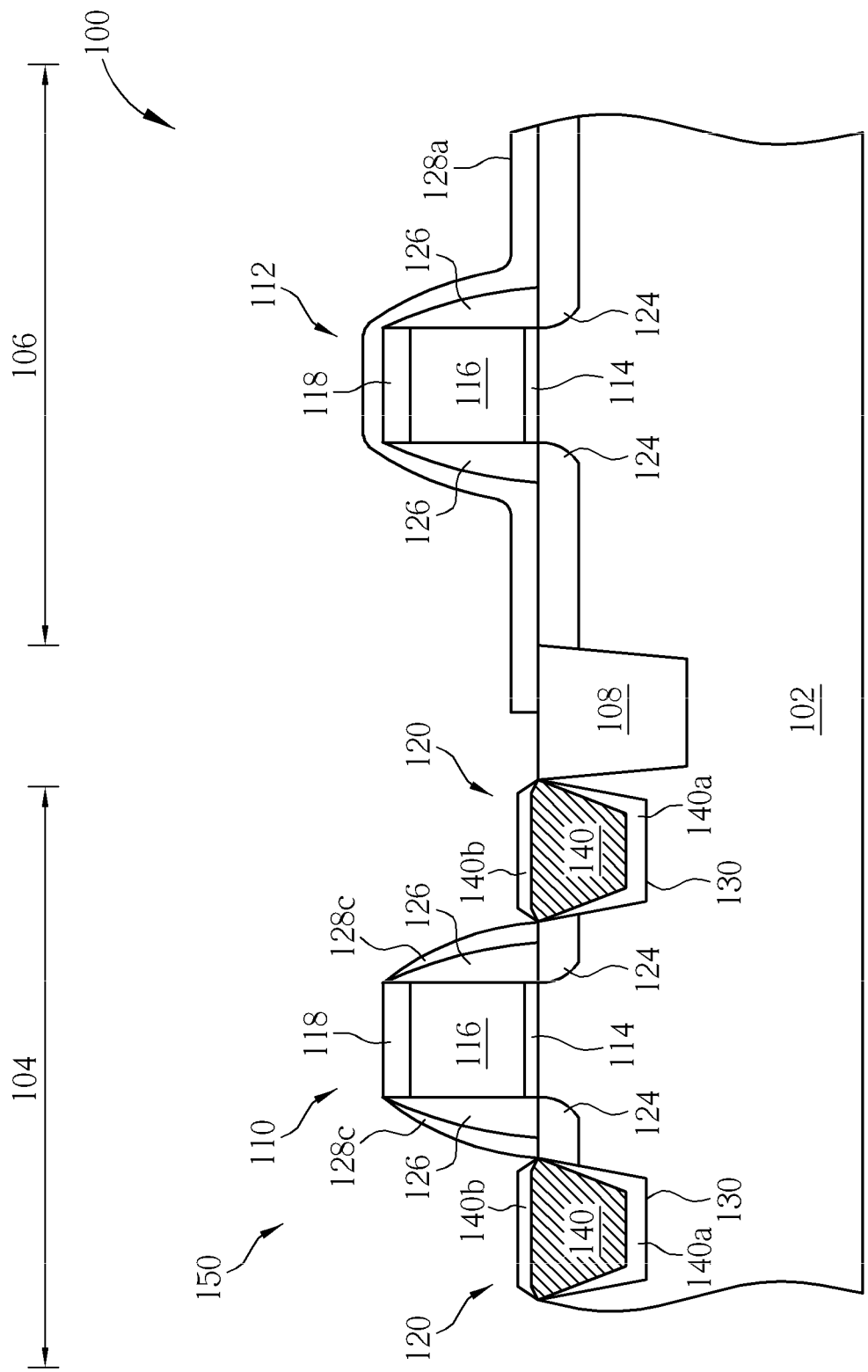

Please refer to FIG. 3. After the cleaning step, a SEG process is performed to form a first epitaxial structure 140 in each first recess 130. The first epitaxial structure 140 includes a first semiconductor material and a second semiconductor material. The first semiconductor material has a first lattice constant while the second semiconductor material has a second lattice constant, and the second lattice constant is larger than the first lattice constant. In the preferred embodiment, the first semiconductor material includes Si and the second semiconductor material includes Ge. That means the first epitaxial structure 140 includes SiGe, but not limited to this. In addition, the first epitaxial structure 140 includes a first epitaxy concentration $C_1$, that is a concentration of the second semiconductor material. For example, the first epitaxy concentration $C_1$ is higher than 30%, preferably higher than 45% in the preferred embodiment. Because the lattice constant of SiGe is larger than that of the substrate, the epitaxial SiGe structure serves as a strained-silicon structure and causes changes to band structure. Therefore the carrier mobility in the channel region is increased. Additionally, a surface of the first epitaxial structure 140 and a surface of the substrate 102 can be non-coplanar as shown in FIG. 3. Particularly speaking, the surface of the first epitaxial structure 140 is higher than the surface of the substrate 102.

Furthermore, ion implantation can be performed before or after forming the first epitaxial structures 140, or during forming the first epitaxial structures 140. Thus the first epitaxial structures 140 serve as a p-type first source/drain 120 of a first transistor device 150 according to the preferred embodiment. In other words, the first source/drain 120 having the first epitaxial structure 140 is formed in the first recess 130. Because the ion implantation and choices of the dopant are well-known to those skilled in the art, the details are omitted herein in the interest of brevity.

Moreover, an undoped epitaxial layer 140a is selectively formed in the first recesses 130 after the cleaning step but before the SEG process. An epitaxy concentration of the second semiconductor material in the undoped epitaxial layer 140a is lower than the first epitaxy concentration $C_1$ in the first epitaxial structure 140. The epitaxy concentration of the second semiconductor material in the undoped epitaxial layer 140a can even be 0%. In other words, the undoped epitaxial layer 140a can be an epitaxial SiGe layer of low epitaxy concentration or an epitaxial silicon layer. The undoped epitaxial layer 140a is provided to solve the Vt roll-off problem due to the distinctive difference between the lattice constant of the first epitaxial structures 140 and that of the substrate 102. After forming the first epitaxial structures 140, another undoped epitaxial layer 140b is selectively formed on the surface of the first epitaxial structures 140. An epitaxy concentration of the second semiconductor material in the undoped epitaxial layer 140b is lower than the first epitaxy concentration $C_1$ in the first epitaxial structure 140. The epitaxy concentration of the second semiconductor material in the undoped epitaxial layer 140b can even be 0%. In other words, the undoped epitaxial layer 140b can be an epitaxial SiGe layer of low epitaxy concentration or an epitaxial silicon layer. The undoped epitaxial layer 140b is provided to serves as a reacting subject in the silicide process, therefore agglomeration formed by metals and Ge in the silicide process is avoided.

Figure 4:
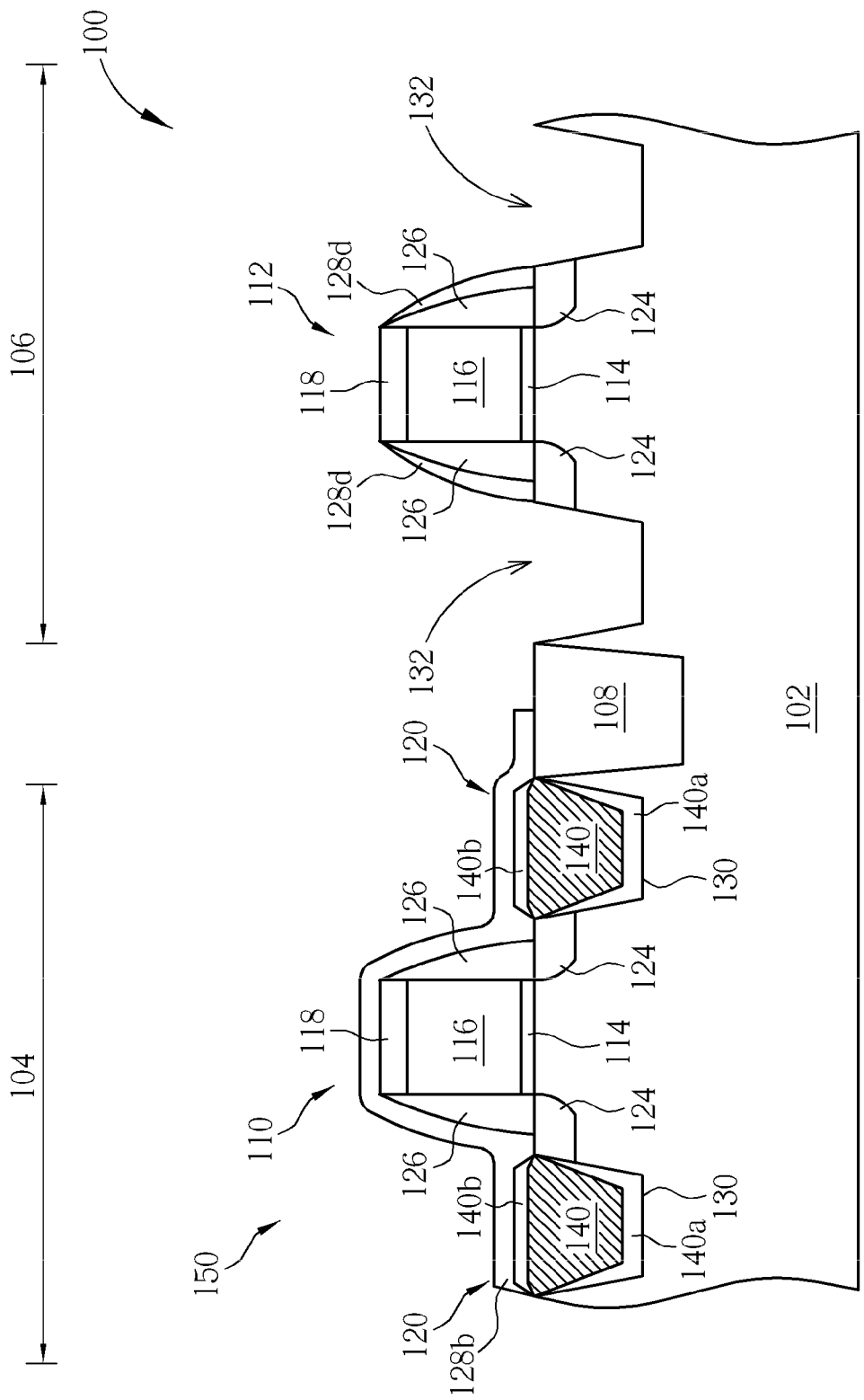

Please refer to FIG. 4. After forming the first epitaxial structures 140, the patterned mask layer 128a and the disposal spacer 128c are removed and followed by forming another patterned mask layer 128b in the first region 104. Then, the patterned mask layer 128b, the patterned hard mask 118 and the spacer 126 serve as an etching mask and another etching process is performed to form a disposal spacer 1 28d on the spacer 126 and second recesses 132 in the substrate 102 respectively at two sides of the second gate structure 112 in the second region 106.

Figure 5:
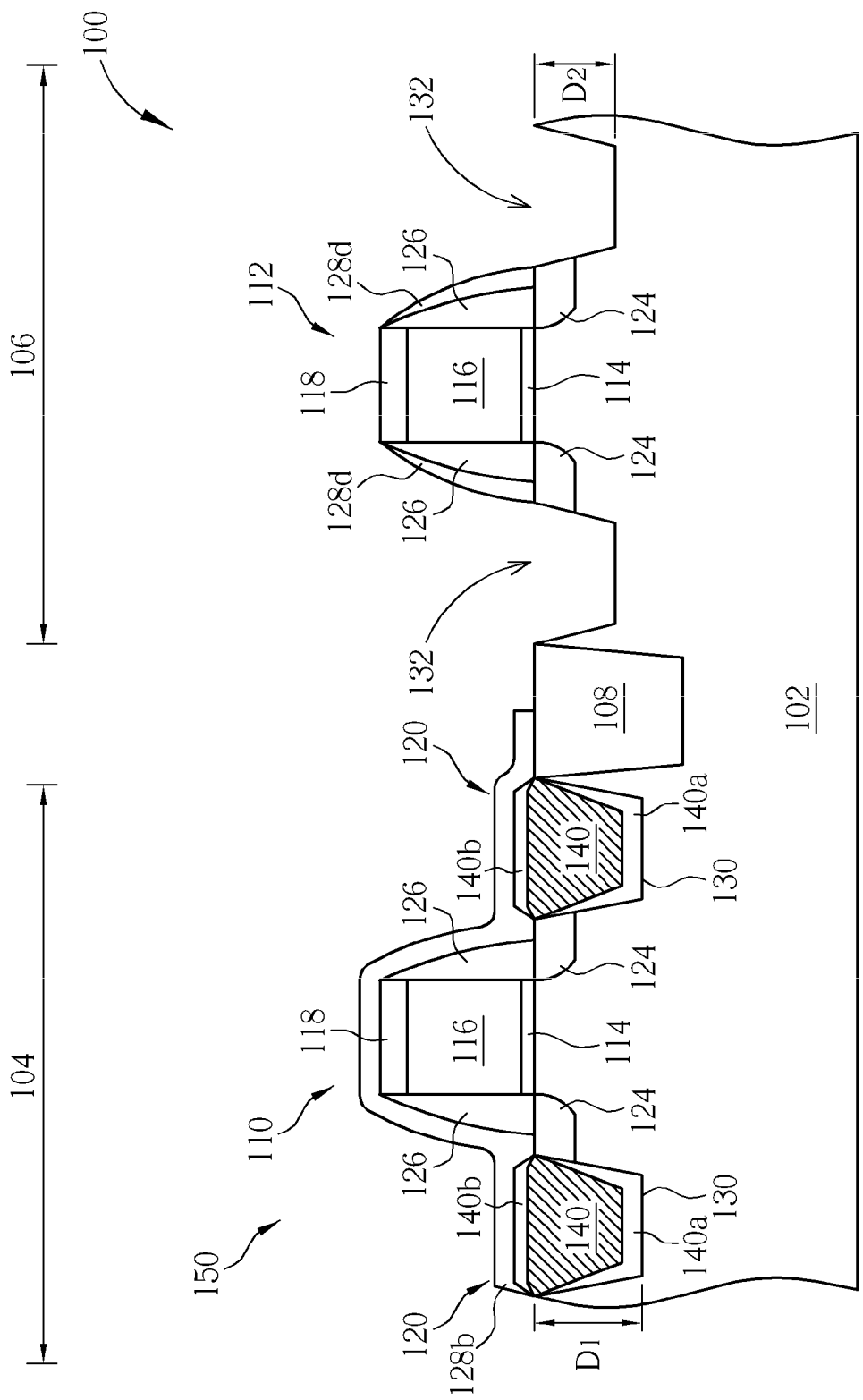

Please refer to FIG. 5, which is a schematic drawing illustrating a modification to the preferred embodiment. According to the modification, a depth of the first recess 130 is different from a depth of the second recess 132. For example, the first recess 130 includes a first depth $D_1$ and the second recess 132 includes a second depth $D_2$. The first depth $D_1$ is larger than the second depth $D_2$ as shown in FIG. 5. Since the first depth $D_1$ is larger than the second depth $D_2$, the first epitaxial structures 140 formed in the first recess 130 provide the strain stress to the channel region of the first transistor device 150 more efficaciously.

Figure 6:
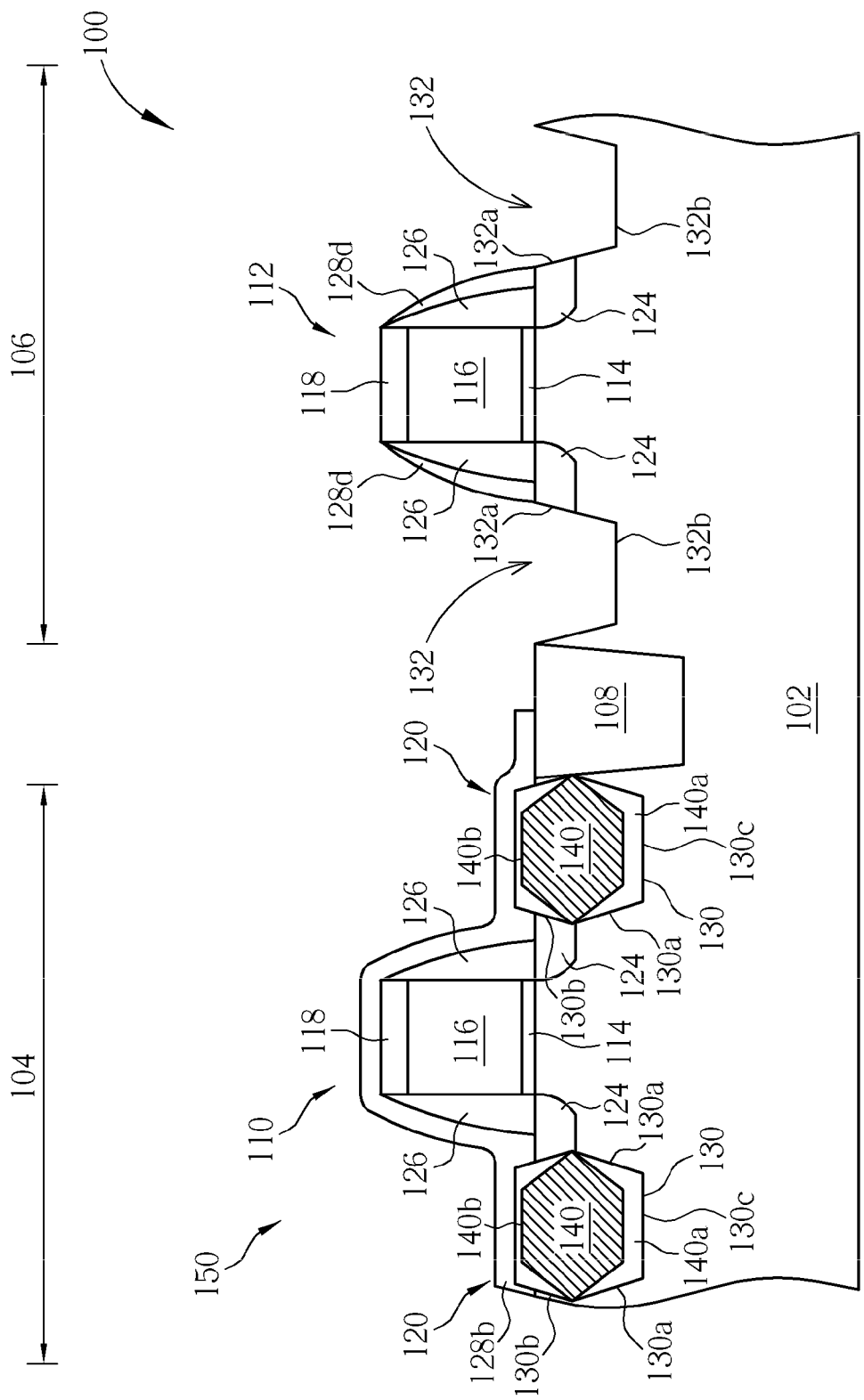

Please refer to FIG. 6, which is a schematic drawing illustrating another modification to the preferred embodiment. According to the modification, the first recess 130 and the second recess 132 can have different shapes, thus the epitaxial structures formed in the first recess 130 and the second recess 132 obtain different shapes. For example, a dry etching process and a suitable wet etching process can be sequentially performed to form the first recesses 130 having different crystal planes in the substrate 102 as shown in FIG. 6. Thus the first recesses 130 including first slanted sidewalls 130a, second slanted sidewalls 130b, and a flat bottom 130c are obtained. Different from the first recesses 130, the second recesses 132 are formed by performing only the dry etching process or wet etching process in a short time. Thus the second recesses 132 include a flat bottom 132b and sidewalls 132a substantially vertical to the flat bottom 132b. Consequently, the first epitaxial structure 140 formed in the first recess 130 obtains a diamond shape having a pointed end toward the channel region, and thus effective stress provided by the first epitaxial structures 140 to the channel region of the first transistor device 150 is enhanced.

Figure 7:
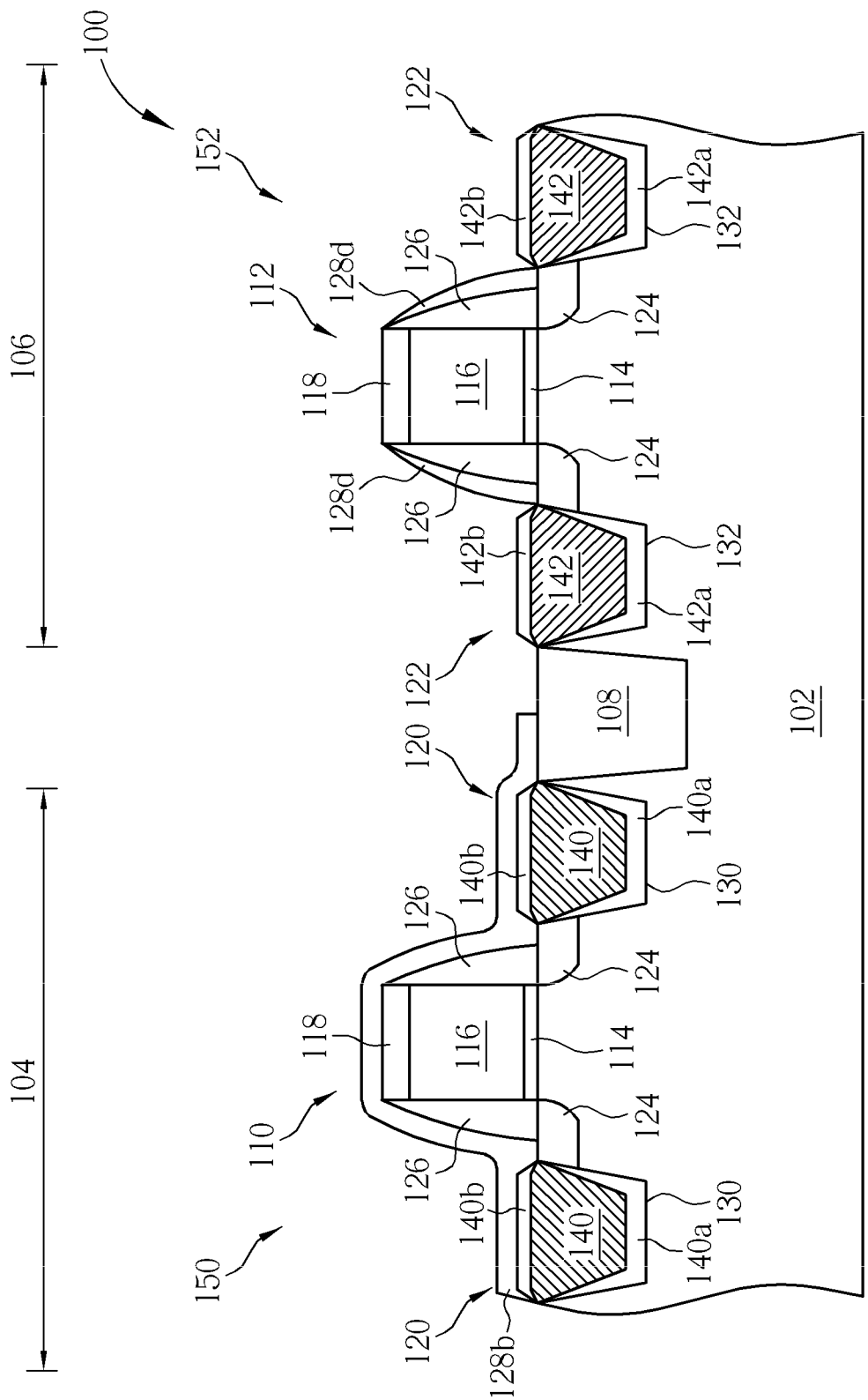

However, the first recesses 130 and the second recesses 132 can have the same shapes and the same depths as shown in FIGS. 4 and 7. After the cleaning step, a SEG process is performed to form a second epitaxial structure 142 in each second recess 132. The second epitaxial structure 142 includes the first semiconductor material and the second semiconductor material as mentioned above. That means the second epitaxial structure 142 includes SiGe, but not limited to this. In addition, the second semiconductor material in the second epitaxial structures 142 can be different from that in the first epitaxial structures 140. Furthermore, the second epitaxial structure 142 includes a second epitaxy concentration $C_2$, that is a concentration of the second semiconductor material. It is noteworthy that the first epitaxy concentration $C_1$ and the second epitaxy concentration $C_2$ are different. Preferably, the first epitaxy concentration $C_1$ is higher than the second epitaxy concentration $C_2$. For example, the second epitaxy concentration $C_2$ is lower than 30%, preferably lower than 25% in the preferred embodiment. It is noteworthy that since the first epitaxy concentration $C_1$ is higher than the second epitaxy concentration $C_2$, the first epitaxial structures 140 provide more stress than the second epitaxial structures 142.

In the same concept, ion implantation can be performed before or after forming the second epitaxial structures 142, or during forming the second epitaxial structures 142. Thus the second epitaxial structures 142 serve as a p-type second source/drain 122 of a second transistor device 152 according to the preferred embodiment. In other words, the second source/drain 122 having the second epitaxial structure 142 is formed in the second recess 132. Because the ion implantation and choices of the dopant are well-known to those skilled in the art, the details are omitted herein in the interest of brevity. After forming the second epitaxial structures 142, the patterned mask layer 128b and the disposal spacer 128d are removed.

Also in the same concept, an undoped epitaxial layer 142a is selectively formed in the second recesses 132 after the cleaning step but before the SEG process and an undoped epitaxial layer 142b is selectively formed on the surface of the second epitaxial structures 142. Epitaxy concentrations of the second semiconductor material in the undoped epitaxial layers 142a and the undoped epitaxial layers 142b are both lower than the second epitaxy concentration $C_2$ in the second epitaxial structures 142. The concentrations of the second semiconductor material in the undoped epitaxial layer 142a and the undoped epitaxial layer 142b can even be 0%. In other words, the undoped epitaxial layers 142a and the undoped epitaxial layers 142b can be epitaxial SiGe layers of low epitaxy concentration or epitaxial silicon layers.

According to the semiconductor devices 100 provided by the first preferred embodiment, the first transistor device 150 and the second transistor device 152 are strained-silicon MOS device with the first epitaxial structures 140 and the second epitaxial structures 142 respectively provide strain stresses to the first transistor device 150 and the second transistor device 152. In other words, the first source/drain 120 and the second source/drain 122 serve as a strained silicon structure and provide the required stresses to the first transistor device 150 and the second transistor device 152, respectively. It is noteworthy that though the first transistor device 150 and the second transistor device 152 include the same conductivity type, the first transistor device 150 and the second transistor device 152 have different functions and therefore require different magnitudes of stresses. As a countermeasure to this issue, the preferred embodiment provides the first recess 130 and the second recess 132 with different depths or different shapes, or provides the first epitaxial structure 140 and the second epitaxial structure 142 having different epitaxy concentrations. Accordingly, the first transistor device 150 and the second transistor device 152 obtain stresses of different magnitudes. Briefly speaking, the semiconductor devices 100 provided by the preferred embodiment satisfy requirements of different strain stresses for devices having different functions, and thus the transistor devices 150/152 which perform different functions are all improved.

Furthermore, the first transistor device 150 and the second transistor device 152 can be two devices having different critical dimension (CD) size while the conductivity types and functions of the first transistor device 150 and the second transistor device 152 are the same. For example, a CD size of the first transistor device 150 is smaller than that of the second transistor device 152, therefore the first transistor device 150 requires higher stress. Accordingly, the first epitaxial concentration $C_1$ of the first epitaxial structures 140 is higher than the second epitaxial concentration $C_2$ of the second epitaxial structures 142.

Additionally, the present invention provides another embodiment of which the first recesses 130 and the second recesses 132 are simultaneously formed while the first epitaxial structures 140 and the second epitaxial structures 142 are still formed individually and sequentially. By forming the first epitaxial structures 140 and second epitaxial structures 142 in different time points, the epitaxial concentrations of the first epitaxial structures 140 and second epitaxial structures 142 still can be made different. Such that the different stresses required by the first transistor device 150 and the second transistor device 152 are still realized.

Figure 8:
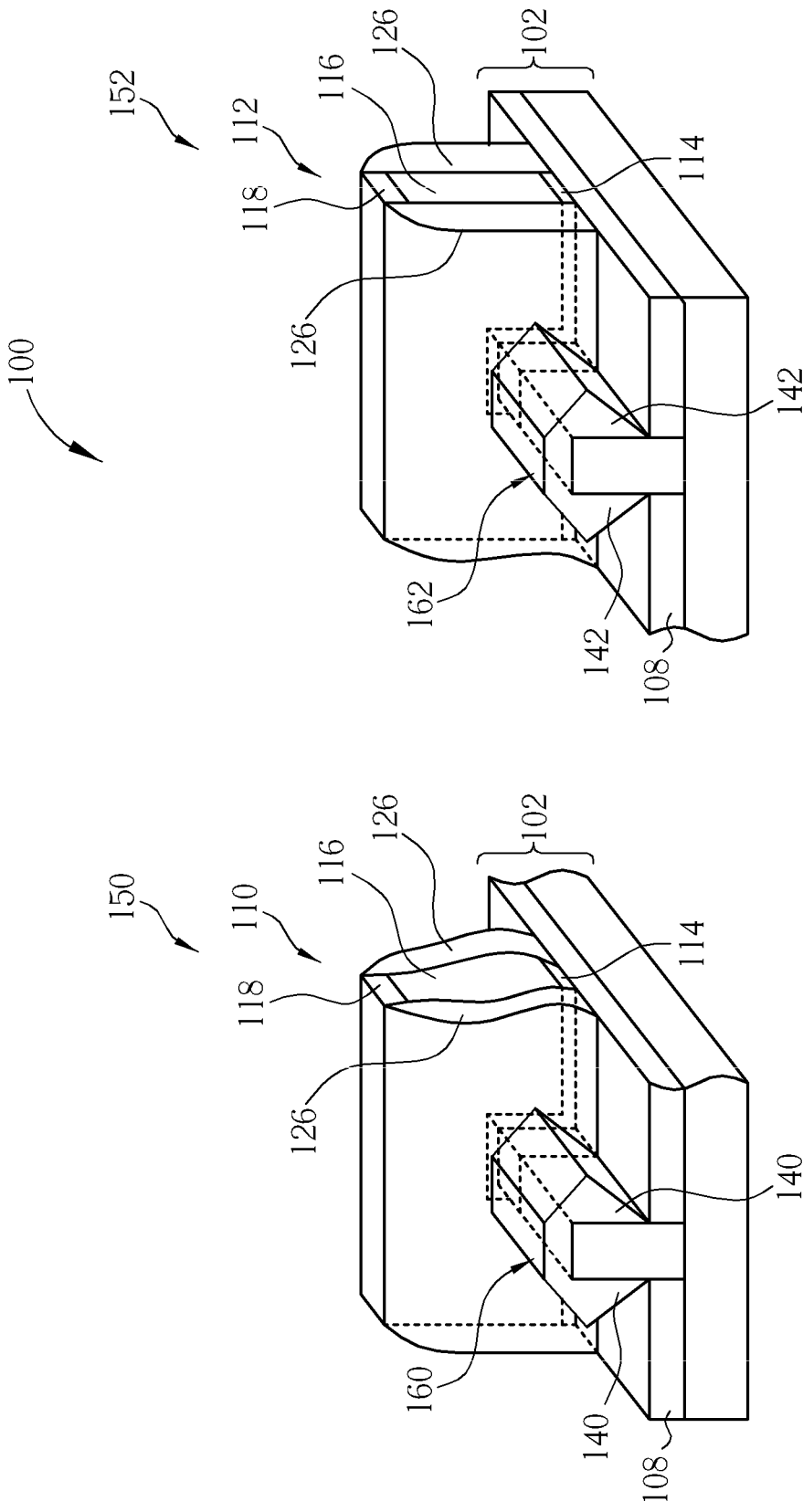
FIG. 8 is a schematic drawing illustrating semiconductor devices provided by a second preferred embodiment of the present invention.

Please refer to FIG. 8, which is a schematic drawing illustrating semiconductor devices provided by a second preferred embodiment of the present invention. It is noteworthy that elements the same in both of the first and second preferred embodiments are designated by the same numerals. As shown in FIG. 8, the preferred embodiment first provides a substrate 102 having a plurality of STIs 108 formed therein. According to the preferred embodiment, the first transistor device 150 includes a first fin structure 160. An extending direction of the first fin structure 160 is perpendicular to an extending direction of the first gate structure 110. And the first gate structure 110 covers a portion of the first fin structure 160, therefore the first fin structure 160 are formed on the substrate 102 on two sides of the first gate structure 110 as shown in FIG. 8.

In the same concept, the second transistor device 152 includes a second fin structure 162, and the second gate structure 112 covers a portion of the second fin structure 162. Therefore the second fin structure 162 are formed on the substrate 102 on two sides of the second gate structure 112 as shown in FIG. 8. As mentioned above, the preferred embodiment also provides a plurality of spacers 126 formed on sidewalls of the first gate structure 110 and of the second gate structure 112, respectively. The first gate structure 110 and the second gate structure 112 respectively include a patterned hard mask 118, and a gate electrode 116 and a gate dielectric layer 114 defined by the patterned hard mask 118.

Accordingly, the first transistor device 150 and the second transistor device 152 provided by the preferred embodiment is a multi-gate transistor device. Furthermore, though the first transistor device 150 and the second transistor device 152 of the preferred embodiment are dual-gate transistor devices as shown in FIG. 8, the first transistor device 150 and the second transistor device 152 still can be tri-gate transistor devices.

More important, the first source/drain 120 is formed in the first fin structure 160 and the second source/drain 122 is formed in the second fin structure 162 according to the preferred embodiment. As mentioned above, the first source/drain 120 includes the first epitaxial structure 140 and the second source/drain 122 includes the second epitaxial structure 142. The first epitaxial structure 140 includes a first epitaxy concentration $C_1$, the second epitaxial structure 142 includes a second epitaxy concentration $C_2$, and the first epitaxy concentration $C_1$ is higher than the second epitaxy concentration $C_2$. For example, the first epitaxy concentration $C_1$ is higher than 30% while the second epitaxy concentration $C_2$ is lower than 30%, preferably he first epitaxy concentration $C_1$ is higher than 45% while the second epitaxy concentration $C_2$ is lower than 25%.

According to the preferred embodiment, though the first transistor device 150 and the second transistor device 152 include the same conductivity type, the first transistor device 150 and the second transistor device 152 have different functions and therefore require different magnitudes of stresses. As a countermeasure to this issue, the preferred embodiment provides the first epitaxial structure 140 and the second epitaxial structure 142 having different epitaxy concentrations. Accordingly, the first transistor device 150 and the second transistor device 152 obtain stresses of different magnitudes: When the first transistor device 150 and the second transistor device 152 are PMOS, channel regions of the first transistor device 150 and the second transistor device 152 obtain different compressive stresses, and when the first transistor device 150 and the second transistor device 152 are NMOS, channel regions of the first transistor device 150 and the second transistor device 152 obtain different tensile stresses.

According to the semiconductor devices provided by the present invention, the transistor devices of the same conductivity type include different source/drain such as source/drain having different shapes, different sizes, or providing different strain stresses. Therefore the semiconductor devices provided by the present invention satisfy requirements of different strain stresses for devices having different functions, or for devices having different CD sizes. Furthermore, the semiconductor devices provided by the present invention are easily integrated in the planar semiconductor devices and the non-planar semiconductor devices and therefore are favorable to scale down the devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. Semiconductor devices comprising:
   a substrate;
   a first gate structure and a second gate structure positioned on the substrate, the first gate structure and the second gate structure comprising a same conductivity type; and
   a first source/drain formed in the substrate respectively at two sides of the first gate structure and a second source/drain formed in the substrate respectively at two sides of the second gate structure, the first source/drain and the second source/drain comprises a first epitaxial structure and the second source/drain comprises a second epitaxial structure, the first epitaxial structure comprises a diamond shape and the second epitaxial structure comprise a shape different from the diamond shape, wherein the first epitaxial structure comprises a first epitaxy concentration, the second epitaxial structure comprises a second epitaxy concentration, and the first epitaxy concentration is higher than the second epitaxy concentration; and
   an updoped epitaxial layer respectively formed on a top of the first epitaxial Structure and on a top of the second epitaxial structure.

2. The semiconductor devices according to claim 1, wherein the first gate structure and the first source/drain form a first metal-oxide-semiconductor (MOS) transistor device, and the second gate structure and the second source/drain form a second MOS transistor device.

3. The semiconductor devices according to claim 2, wherein the first MOS transistor device and the second MOS transistor device are strained-silicon transistor devices.

4. The semiconductor devices according to claim 3, wherein the first source/drain is a strained-silicon structure of the first MOS transistor device, the second source/drain is a strained-silicon structure of the second MOS transistor device, respectively, and the first source/drain and the second source/drain provide different magnitudes of stresses.

5. The semiconductor devices according to claim 4, further comprising a first recess formed in the substrate respectively at two sides of the first gate structure and a second recess formed n the substrate respectively at two sides of the second gate structure.

6. The semiconductor devices according to claim 5, wherein the first source/drain is positioned in the first recess and the second source/drain is positioned in the second recess, respectively.

7. The semiconductor devices according to claim 6, wherein the first recess and the second recess comprise different shapes.

8. The semiconductor devices according to claim 6, wherein the first recess and the second recess comprise different depths.

9. The semiconductor devices according to claim 1, wherein the first epitaxy concentration is higher than 30% and the second epitaxy concentration is lower than 30%.

10. The semiconductor devices according to claim 9, wherein the first epitaxy concentration is higher than 45% and the second epitaxy concentration is lower than 25%.

11. The semiconductor devices according to claim 4, further comprising a first fin structure and a second fin structure positioned on the substrate.

12. The semiconductor devices according to claim 11, wherein the first gate structure covers a portion of the first fin structure and the second gate structure covers a portion of the second fin structure.

13. The semiconductor devices according to claim 11, wherein the first source/drain is formed in the first fin structure and the second source/drain is formed in the second fin structure.

* * * * *